United States Patent
Visser

(10) Patent No.: US 7,876,562 B2
(45) Date of Patent: Jan. 25, 2011

(54) ELECTRONIC MODULE HAVING THERMAL COOLING INSERT

(75) Inventor: Roy A. Visser, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 200 days.

(21) Appl. No.: 12/074,424

(22) Filed: Mar. 4, 2008

(65) Prior Publication Data

US 2009/0225512 A1    Sep. 10, 2009

(51) Int. Cl.
*H05K 7/20* (2006.01)
*F28F 7/00* (2006.01)
*H01L 23/34* (2006.01)
*F01P 1/06* (2006.01)
*F15D 1/04* (2006.01)
*F17D 3/00* (2006.01)

(52) U.S. Cl. ............... 361/699; 361/715; 165/80.4; 165/80.5; 165/104.33; 257/714; 257/716; 174/15.1; 174/547; 123/41.31; 138/39; 138/40; 137/599.01; 137/561 R

(58) Field of Classification Search ......... 361/698–700, 361/713, 715, 719; 165/80.2–80.4, 104.33, 165/185, 169; 257/714–716; 174/15.1, 17.06, 174/17 IF, 547, 548; 123/41.31, 406.47; 138/39–40; 137/599.01, 561 R
See application file for complete search history.

(56) References Cited

U.S. PATENT DOCUMENTS

| 1,506,722 | A | * | 8/1924 | Yunker | 29/890.143 |
|---|---|---|---|---|---|
| 2,895,508 | A | * | 7/1959 | Drake | 138/38 |
| 5,841,634 | A | | 11/1998 | Visser | |
| 6,396,692 | B1 | * | 5/2002 | Farshi et al. | 361/690 |
| 2002/0166519 | A1 | | 11/2002 | Skrzypchak et al. | |
| 2004/0257757 | A1 | | 12/2004 | Schweinbenz et al. | |
| 2006/0291165 | A1 | * | 12/2006 | Flesch et al. | 361/699 |
| 2007/0289718 | A1 | | 12/2007 | McCordic et al. | |

OTHER PUBLICATIONS

European Search Report dated Jul. 9, 2009.

* cited by examiner

*Primary Examiner*—Zachary M Pape
(74) *Attorney, Agent, or Firm*—Jimmy L. Funke

(57) ABSTRACT

An electronic module is provided having enhanced thermal cooling of electronics. The module includes a housing, electronic circuitry contained within the housing, and a fluid cooling chamber extending through the housing. The chamber has generally conical shaped portions at opposite ends. At least one thermal cooling insert extends into the chamber. The insert comprises a plurality of projections for forming fluid flow passages between adjacent projections, wherein the projections engage the generally conical shape portion of the chamber.

18 Claims, 4 Drawing Sheets

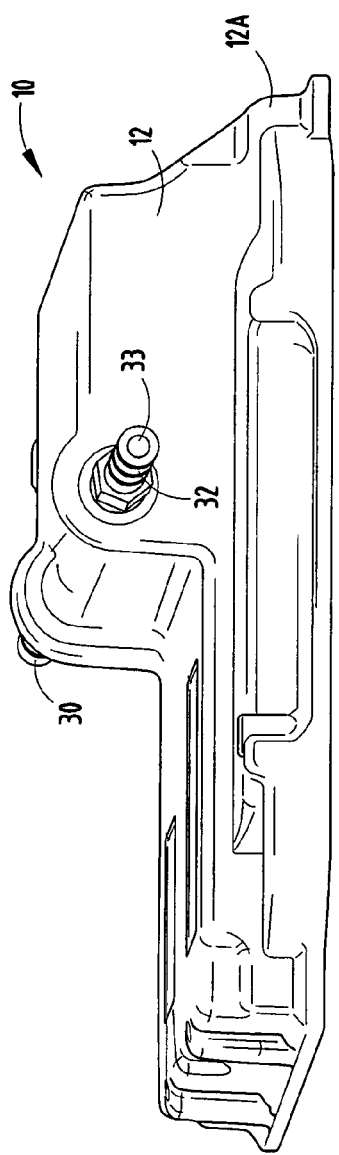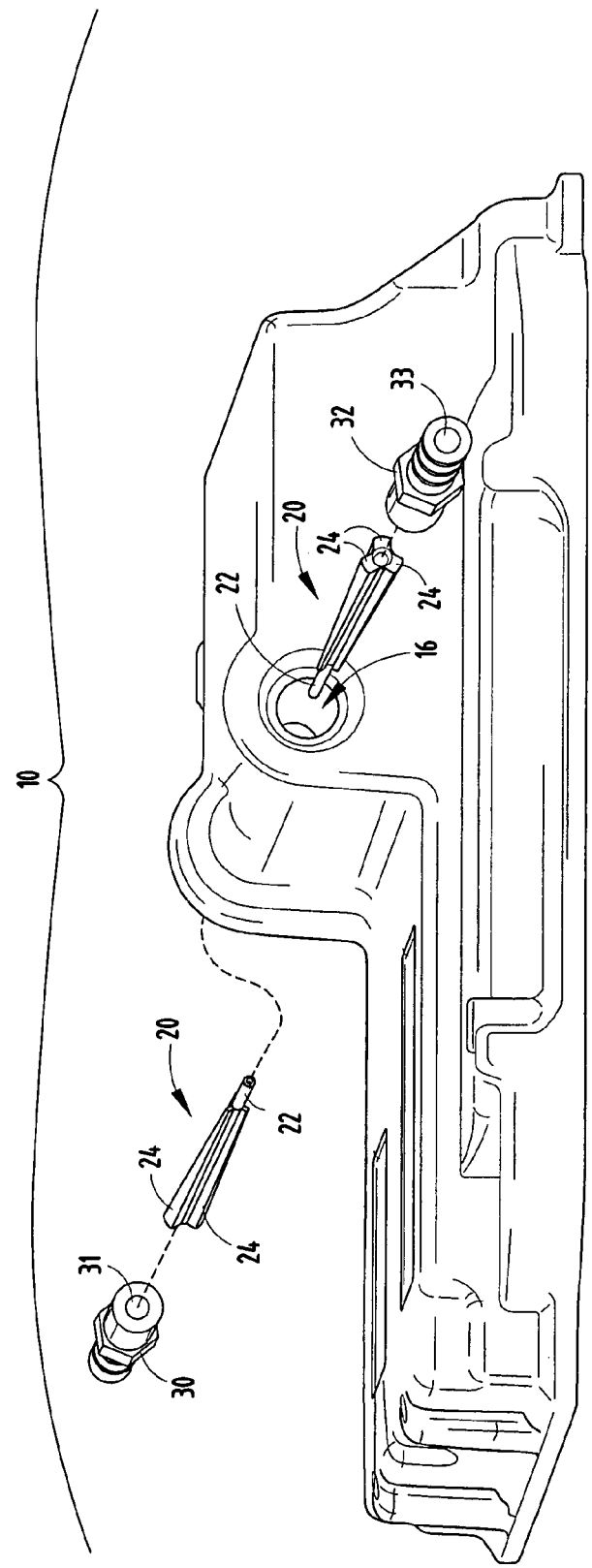
FIG. 1
FIG. 2

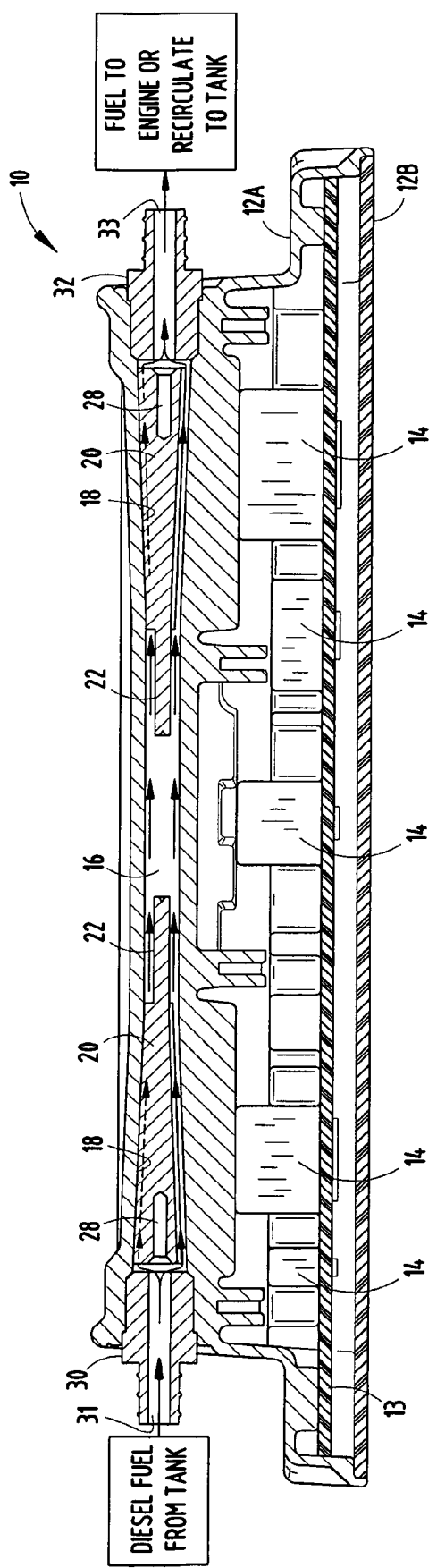
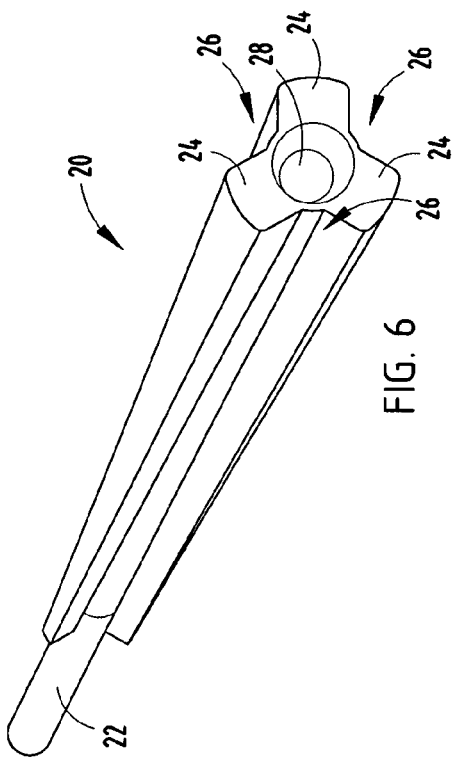
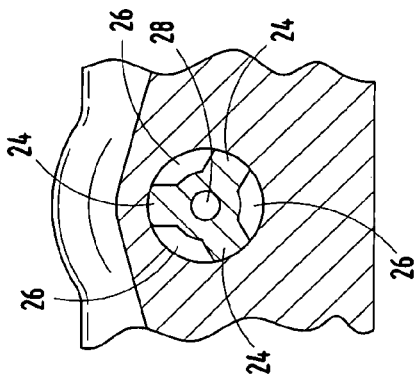
FIG. 4
FIG. 5
FIG. 6

ELECTRONIC MODULE HAVING THERMAL COOLING INSERT

TECHNICAL FIELD

The present invention generally relates to electronic devices and, more particularly, relates to an electronic module having a thermal cooling fluid passage for cooling the electronic device.

BACKGROUND OF THE INVENTION

Power electronic modules or assemblies typically employ electronic devices that generally include electrical circuitry for conducting electrical current which, in turn, generates thermal energy (i.e., heat). Automotive high-power electronics, such as those employed in diesel engine vehicles, electric vehicles and hybrid/electric vehicles, typically generate a significant amount of thermal energy during operation. Excessive heat buildup may cause reduced performance including electrical circuit failure. Thus, thermal energy generally must be dissipated and transferred away from the electronics to ensure adequate operation. Additionally, the power capability of the electronic devices and size of the electronic module generally depend upon the amount of heat dissipation that may be achieved.

For very high-power applications, enhanced cooling of electronics may be required. Some electronic modules may employ a heat sink device having a fluid vessel in fluid communication with automotive radiator antifreeze. The heat sink device is generally positioned in thermal communication with the electronics such that fluid coolant flows in heat transfer communication with the electronics to cool the electronics.

While electronic modules or assemblies have employed fluid, such as liquid coolant, to achieve cooling of electronics, it is desirable to provide for thermal cooling of an electronic module in a manner that sufficiently cools the electronics without undesirable drawbacks.

SUMMARY OF THE INVENTION

According to one aspect of the present invention, an electronic module having a fluid coolant chamber to cool electronics is provided. The module includes a housing and electronic circuitry contained within the housing. A fluid coolant chamber extends through the housing and includes a generally conical shaped portion. The electronic module further includes at least one thermal cooling insert extending into the opening. The thermal insert has a plurality of projections for forming fluid flow passages between adjacent projections, wherein the projections engage the generally conical shaped portion of the chamber.

According to another aspect of the present invention, a thermal cooling insert is provided for directing fluid coolant passing through a coolant chamber in an electronic module to cool electronics. The thermal cooling insert includes a central rod extending longitudinally and adapted to be inserted into a coolant chamber in an electronic module. The thermal cooling insert also includes a plurality of projections extending longitudinally from the central rod. The projections form a plurality of fluid flow passages between adjacent projections. The projections are adapted to engage a generally conical shaped portion of the coolant chamber in the electronic module such that fluid passing between the projections serves as a coolant.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which:

FIG. 1 is a perspective view of an electronic module employing thermal cooling inserts (baffles) according to one embodiment of the present invention;

FIG. 2 is a partial exploded view of the electronic module showing the thermal cooling inserts and outer end fittings removed;

FIG. 4 is a cross-sectional view of the electronic module taken through line IV-IV of FIG. 3;

FIG. 5 is a cross-sectional view of the electronic module taken through line V-V of FIG. 3;

FIG. 6 is an enlarged perspective view of one of the thermal cooling inserts.

DESCRIPTION OF THE PREFERRED EMBODIMENT

Figure 3:
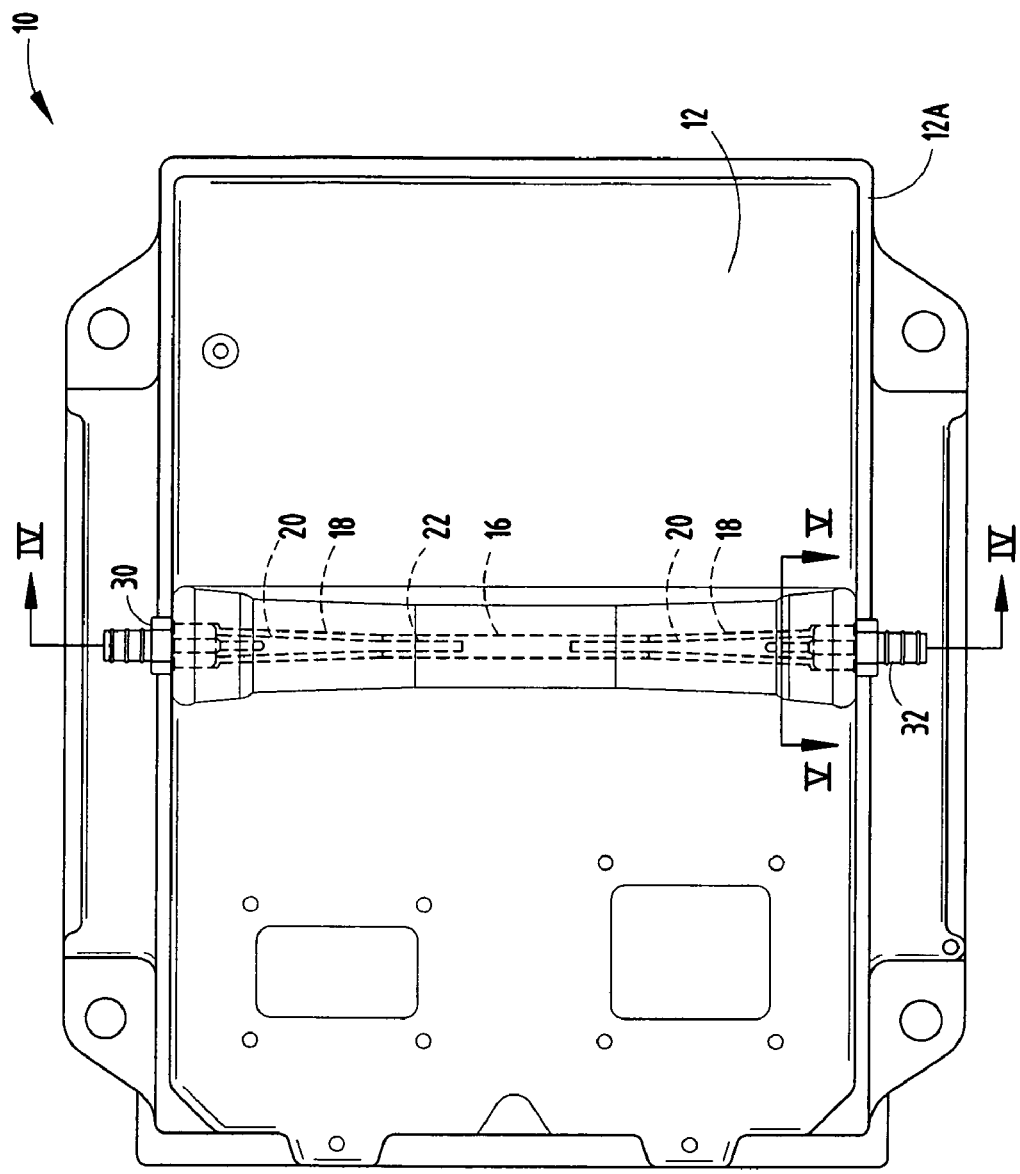
FIG. 3 is a plan view of the electronic module further illustrating the fluid cooling.
Figure 7:
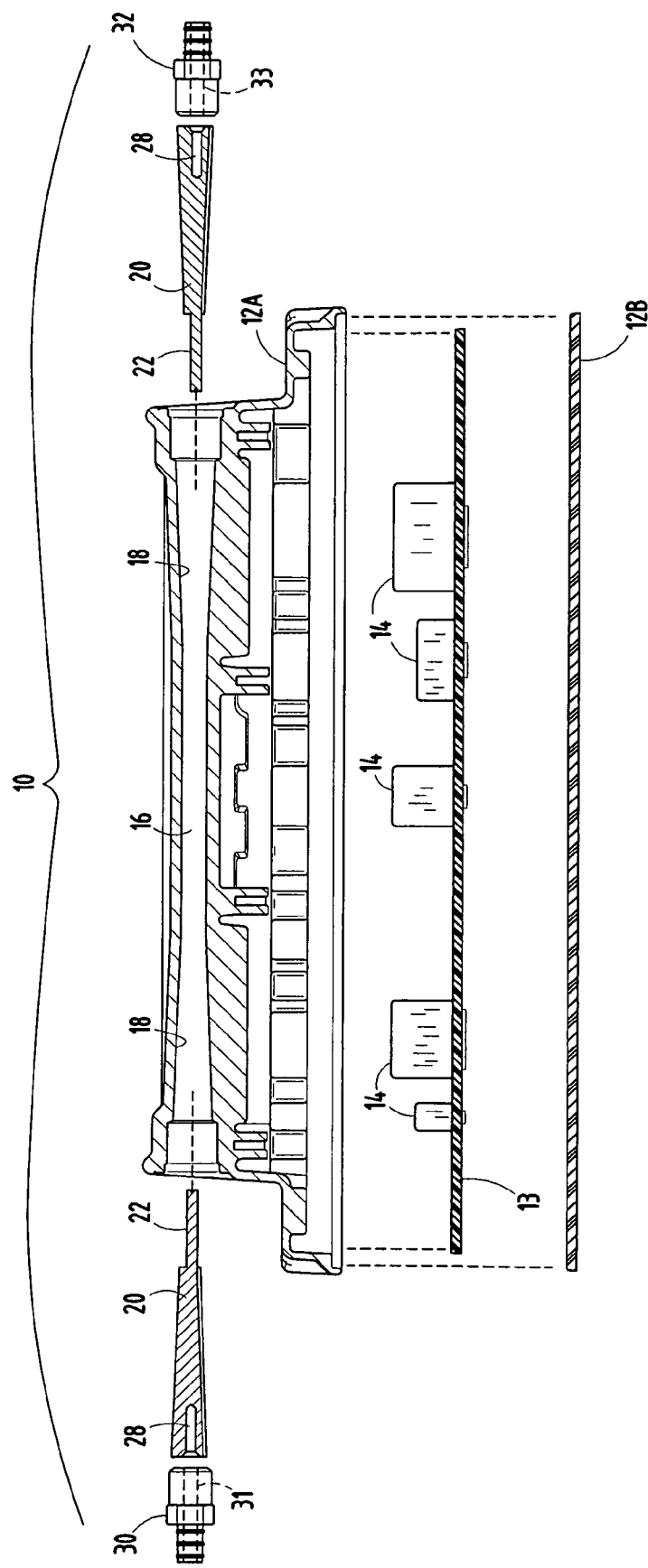
FIG. 7 is a partial exploded cross-sectional view of the electronic module further illustrating the thermal cooling inserts and fittings removed.

Referring to FIGS. 1-4, an electronic module or assembly 10 is generally illustrated according to one embodiment of the present invention. The electronic module 10 generally includes a housing containing one or more electronic devices having electrical circuitry. The housing 12 is generally shown made up of an upper housing member 12A connected to a lower housing member 12B. Housing members 12A and 12B may be connected together by way of one or more fasteners, adhesives or other known connections. According to one embodiment, the housing 12 is a metal housing that serves as a thermally conductive medium which provides a high thermal energy exchange rate. In an exemplary embodiment, the housing 12 is made of aluminum or aluminum alloy which may be cast in a die. According to another embodiment, the housing 12 may be made of zinc. It should be appreciated that the housing 12 may be made of other thermally conductive materials.

The housing 12 generally provides for a compartment which contains one or more electronic devices. In the embodiment shown, a circuit board 13, such as a printed circuit board (PCB), is contained within the compartment of housing 12. The circuit board 13 may include a substrate made of alumina, a low temperature co-fired ceramic (LTCC), aluminum nitride, stainless steel, or other known substrate materials. The circuit board 13 may be assembled by way of fasteners to the upper housing member 12A. One or more electronic devices 14 are provided on the circuit board 13. In the embodiment shown, the circuit board 13 and the electronic devices 14 mounted thereto may be in contact with the underlying surface of upper housing member 12A such that thermal energy (heat) may be efficiently transferred from the electronic devices 14 and the circuit board 13 to upper housing member 12A. Thus, the electronic devices 14 are arranged in heat transfer relationship with the housing 12.

Additionally, thermal conductive pedestals may be disposed between the housing 12 and one or more of the circuit board 13 and electronic devices 14.

The electronic devices 14 may include any of a number of electronic devices having electrical circuitry. In one embodiment, the electronic module 10 is a diesel engine control module (ECM) having electronic devices 14 that operate at high power levels and generate relatively high amounts of thermal energy. Examples of electronic devices 14 may include control electronics that implement enhanced diesel emission controls and may include one or more semiconductor devices or packages, such as transistors configured to provide controlled switching operation, operate as a diode, provide voltage regulation or perform various other functions. The electronic devices 14 may be fabricated semiconductor chips, such as a flip chip die/device with solder bumps or wire bonded connections that are electrically and/or physically coupled to the underlying substrate 13. The electronic devices 14 may also include passive and active circuit components. Further examples of electronic devices 14 may include field effect transistors (FETs), isolated gate bipolar transistors (IGBTs), power inverters, DC-to-DC converter, DC-to-AC converter, power resistors, power diodes and other devices. The electronic devices 14 generally generate thermal energy (heat) when conducting electrical current during operation. The circuit board 13 can also generate heat itself via electrical conduction losses and benefit from thermal contact with the housing 12 as shown in FIG. 4. Electronic devices can conduct their heat to the circuit board 13. Circuit board 13 can then benefit by thermal contact with housing 12.

The electronic module 10 is further configured to include a fluid coolant opening or chamber 16 that generally extends through the upper housing member 12A between a fluid coolant inlet and an outlet. In the embodiment shown, the fluid coolant chamber 16 does not extend within the compartment containing the electronic devices 14, but instead has its own fluid flow chamber in heat transfer relation to the electronic devices 14. As shown in FIG. 4, the fluid coolant chamber 16 has two generally conical portions 18 provided at opposite ends generally at the fluid coolant inlet and outlet. Each of the generally conical shaped portions 18 of chamber 16 are wider at the ends of the chamber and taper in towards the central portion of the chamber 16. The conical shaped portions 18 may include a taper of approximately one to ten degrees (1° to 10°) for half angle relative to the central longitudinal axis which corresponds to two to twenty degrees (2° to 20°) for full angle, according to one embodiment. According to another embodiment, the taper has a half angle of about one to three degrees (1° to 3°), and in one specific embodiment the taper is about two degrees (2°), relative to the longitudinal axis.

The fluid coolant chamber 16 generally receives a fluid coolant that passes through the chamber 16 in thermal communication with the housing 12 so as to exchange thermal energy (heat) and thereby remove thermal energy from the electronic module 10. According to one embodiment, the fluid coolant is liquid diesel fuel supplied from a fuel reservoir tank onboard a vehicle. According to this embodiment, the diesel fuel may pass through the fluid coolant chamber 16 to cool electronics in heat transfer relationship with chamber 16 and then may be passed to the vehicle engine for use as fuel to power the engine or may be recirculated to the fuel reservoir tank, according to a vehicle application. According to other embodiments, the fluid coolant may include other liquids such as hydraulic oil, motor (engine) oil, engine coolant, such as ethylene-glycol antifreeze solution, alcohol and water. According to further embodiments, the fluid coolant may include a refrigerant that may be in a gas state and/or liquid state, such as Freon® or refrigerant 134. It should be appreciated that according to some embodiments, the fluid coolant may be a fluid that is used primarily by the vehicle and as a secondary use is utilized to exchange heat from the electronic assembly 10.

Disposed within the fluid coolant chamber 16 are first and second thermal cooling inserts 20 that serve as baffles to disperse the fluid coolant as it passes through chamber 16 and transfers thermal energy to the fluid coolant medium. The first and second thermal cooling inserts 20 are made of a thermally conductive material, such as aluminum or aluminum alloy, that conducts thermal energy (heat) and creates a large surface area over which fluid coolant passes to exchange the thermal heat from the housing 12 to the fluid coolant where it is transferred to an outside environment.

The first thermal cooling insert 20 is disposed in one end of chamber 16, within the generally conical shaped portion 18 of chamber 16. The second fluid cooling insert 20 is disposed in the opposite end of chamber 16, also in the generally conical shaped portion 18 of chamber 16. The thermal cooling inserts 20 are baffles with a bi-directional coaxial geometry that generally have plural (e.g., three) outer surfaces that generally conforms to the generally conical shaped portion 18 of chamber 16 so that the outmost surfaces engage the chamber 16. The inserts 20 may be easily inserted into the chamber 16 at either end and forced sufficiently into place in contact with the inner walls of the generally conical shaped portions 18 of chamber 16.

Once the thermal cooling inserts 20 are disposed within the opposite ends of chamber 16, first and second outer end fittings 30 and 32 are connected to the housing 12. According to one embodiment, fittings 30 and 32 may be threadingly engaged to the housing. Provided in the first fitting 30 is an inlet port 31 that receives the fluid coolant that passes into chamber 16. Similarly, provided in the second fitting 32 is an outlet port 33 through which fluid coolant exits the chamber 16. The fittings 30 and 32 may further include hose clamps or other connectors for allowing connection to hoses or other fluid delivery mediums.

Referring now to FIGS. 5 and 6, one of the thermal cooling inserts 20 is further illustrated having a cylindrical central rod 22 with a plurality of projections or lobes 24 extending therefrom. According to one embodiment, each thermal cooling insert 20 has three generally uniform straight projections or lobes 24 that extend radially from the central rod 22. The projections 24 are formed having three partial generally conical shaped sections that matches the inside shape and size of the generally conical shaped portion 18 of chamber 16.

The thermal cooling inserts 20 have the generally uniform straight projections 24 formed having an outer surface that conforms to the conical shaped portion 18 of chamber 16 such that the projections 24 taper at an angle relative to the longitudinal axis of the central rod 22. According to one embodiment, the projections 24 have a taper of approximately of one to ten degrees (1° to 10°) relative to the central longitudinal axis of the central rod 22. According to another embodiment, the taper of the projections 24 is about one to three degrees (1° to 3°), and in one specific embodiment, the taper is about two degrees (2°) relative to the longitudinal axis of the central rod 22. Accordingly, the projections 24 of inserts 20 provide outer conical shaped portions having a taper that conforms substantially to the shape and size of the conical shaped portion 18 of chamber 16 such that the inserts 20 may be easily inserted into the chamber 16 and forced into place in direct contact therewith. Due to the taper angle, the inserts 20 are wedged into the conical portion 18 of chamber 16 and remain seated therein.

The outer end inserts 30 and 32 are then inserted into the chamber ends to ensure that the inserts 20 remain in position in chamber 16.

Provided between adjacent projections 24 are openings 26 through which fluid coolant flows. As seen in FIG. 5, the openings 26 are provided between adjacent projections 24 and the wall forming chamber 16. It should be appreciated that the projections 24 make direct physical contact with the thermally conductive inner walls of housing 12 in the generally conical shaped portion 18 of chamber 16 such that thermal energy from the housing 12 passes by way of thermal conduction to the thermal cooling inserts 20. As fluid coolant flows through chamber 16, the thermal cooling inserts 20 cause the fluid coolant to be directed into the three fluid flow paths 26 such that the fluid contacts the wall of the chamber 16 and the thermal cooling inserts 20. In doing so, thermal energy is transferred by convection from the housing 12 at the interface area of the chamber 16 and from the thermal cooling inserts 20 to the fluid coolant. The thermal cooling inserts 20 thereby result in a large surface area over which thermal energy may be exchanged from the housing 12. It should be appreciated that inserts 20 serve as baffles that disperse the fluid coolant in a manner that does not create excessive back pressure.

The thermal cooling inserts 20 are shown each having an opening 28 formed in the outer end thereof. The opening 28 is an as-cast hole that may be used with a thread forming screw so that a manufacturer can apply a pull test to enable statistical quality control of the installed insert 20.

The inserts 20 may be rotated in a die cast die such that the smallest face is presented to the part plane with no side pulls required. This may allow a plurality of inserts 20 to be made in a single stroke of a small die cast machine, thus greatly reducing the cost and average machine time to manufacture the part. Additionally, internal ninety degree (90°) cones may be installed for lathe centers on both ends to allow a cleanup cut to meet precision required on conical faces such that no special lathe tooling is required.

To assemble the inserts 20 into the housing 12, the outer housing 12 may be heated and the inserts 20 may be chilled. The inserts 20 may then be inserted into the chamber 16 and tapped such that inserts 20 are sufficiently in place. As the housing 12 and the inserts 20 equalize in temperature, they will tend to lock permanently together which, in one embodiment, forms a metal-to-metal friction interconnection. The conical shape of the inserts 20 and the interfacing chamber 16 simplifies the manufacturing assembly as compared to a cylindrical bore and fits well with the draft required to die cast the metal parts.

Accordingly, the electronic module 10 of the present invention advantageously provides for enhanced cooling of electronics, particularly the electronic devices 14 provided in the module 10. The fluid cooling achieved by way of the fluid coolant channel 16 and thermal cooling inserts 20 providing fluid flow channels between the fluid regulating inserts 20 and the thermally conductive housing 12 allows for the efficient thermal exchange to remove excessive heat from the electronic devices 14 and to transfer the heat to an external environment. By enhancing the heat dissipation, particularly for high-power electronic devices, the electronic module 10 advantageously allows for the reduction in the number and/or size of electronic devices 14 used in the module 10, thereby reducing the size and cost of the overall module 10. Additionally, the enhanced heat dissipation and fluid cooling of the present invention may allow for an increase of power output of the electronic devices, thereby improving the overall performance of the electronic module 10. Further, it should be appreciated that the use of a fluid coolant already present on the vehicle advantageously provides for a secondary cooling function. These and other advantages may be achieved by the novel assembly in the cooling design of the present invention.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

The invention claimed is:

1. An electronic module having a fluid coolant chamber for cooling electronics, said module comprising:
   a housing;
   electronic circuitry contained within the housing;
   the fluid coolant chamber extending through the housing and comprising a generally conical shaped portion; and
   at least one thermal cooling insert having a longitudinal axis and extending into the chamber, said insert comprising a plurality of straight projections extending generally parallel to the longitudinal axis of the insert and having a taper angle relative to the longitudinal axis of the insert for forming multiple fluid flow passages between adjacent projections, wherein the projections engage the generally conical shape portion of the chamber to transfer thermal energy to a fluid coolant in the chamber.

2. The electronic module as defined in claim 1, wherein the chamber comprises first and second conical portions, and wherein the thermal cooling insert includes a first insert comprising a plurality of projections engaging the first generally conical shaped portion of the chamber and a second insert comprising a plurality of projections generally engaging the second generally conical shaped portion of the chamber.

3. The electronic module as defined in claim 2, wherein the first generally conical shaped portion is provided at a first end of the chamber and the second generally conical shaped portion is provided at an opposite second end of the chamber.

4. The electronic module as defined in claim 1, wherein the insert comprises three equi-angularly oriented projections extending generally longitudinally along the insert.

5. The electronic module as defined in claim 4, wherein the insert comprises a generally cylindrical central rod, with the projections extending from the rod.

6. The electronic module as defined in claim 1 further comprising a threaded opening provided at an outer end of the insert for allowing engagement of the insert for removal from the chamber.

7. The electronic module as defined in claim 1, wherein the fluid comprises a liquid.

8. The electronic module as defined in claim 7, wherein the liquid comprises diesel fuel.

9. The electronic module as defined in claim 1, wherein the generally conical shaped portion of the fluid coolant chamber has a half angle taper in the range of about one to ten degrees (1° to 10°) and the projections have a taper angle relative to the longitudinal axis of the insert of approximately one to ten degrees (1° to 10°).

10. The electronic module as defined in claim 9, wherein the generally conical shaped portion of the fluid coolant chamber has a half angle taper in the range of about one to three degrees (1° to 3°) and the projections have a taper angle relative to the longitudinal axis of the insert of approximately one to three degrees (1° to 3°).

11. A thermal cooling insert for directing fluid coolant passing through a coolant chamber in an electronic module to cool electronics, said thermal cooling insert comprising:

a central rod having a longitudinal axis and adapted to be inserted into a fluid coolant chamber in an electronic module; and a plurality of straight projections extending radially from the central rod and generally parallel to the longitudinal axis, said projections forming a plurality of fluid flow passages between adjacent projections, wherein the projections have a taper angle relative to the longitudinal axis adapted to engage a generally conical shaped portion of the chamber in the electronic module to transfer thermal energy to a fluid coolant in the chamber.

12. The thermal cooling insert as defined in claim 11, wherein the insert comprises three equi-angularly oriented projections extending generally longitudinally along the insert.

13. The thermal cooling insert as defined in claim 11 further comprising a threaded opening provided at an outer end of the insert for allowing engagement of the insert for removal from the chamber.

14. The thermal cooling insert as defined in claim 11, wherein the fluid comprises a liquid.

15. The thermal cooling insert as defined in claim 14, wherein the liquid comprises diesel fuel.

16. The thermal cooling insert as defined in claim 11, wherein the projections have a taper angle relative to the longitudinal axis of the insert of approximately one to ten degrees (1° to 10°).

17. The thermal cooling insert as defined in claim 16, wherein the projections have a taper angle relative to the longitudinal axis of the insert of approximately one to three degrees (1° to 3°).

18. The thermal cooling insert as defined in claim 17, wherein the projections have a taper angle of about two degrees (2°).

* * * * *